Feb. 7, 1967 TAKASHI TOKUYAMA ET AL 3,303,069
METHOD OF MANUFACTURING SEMICONDUCTOR DEVICES
Filed Feb. 3, 1964
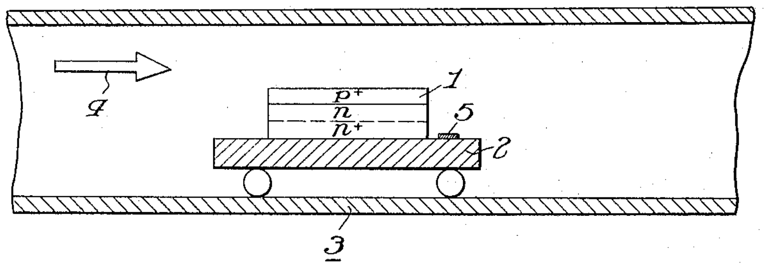

3,303,069
Patented Feb. 7, 1967

3,303,069

METHOD OF MANUFACTURING SEMICONDUCTOR DEVICES

Takashi Tokuyama, Kitatama-gun, Tokyo-to, and Keijiro Uehara, Kita-ku, Tokyo-to, Japan, assignors to Kabushiki Kaisha Hitachi Seisakusho, Tokyo-to, Japan, a joint-stock company of Japan Filed Feb. 3, 1964, Ser. No. 342,079
Claims priority, application Japan, Feb. 4, 1963, 38/4,488
1 Claim. (Cl. 148—187)

This invention relates to an improved method of manufacturing semiconductor devices and more particularly semiconductor devices having oxide films on their surfaces.

It has been well known in the art to provide an oxide film on the surface of a semiconductor device, more particularly a semiconductor device utilizing silicon, in order to improve the stability and reliability of the electrical characteristics of the device. While various methods of forming the oxide film are known, the method which can be utilized in carrying out this invention comprises the steps of completing a semiconductor junction, especially a p-n junction in the base material or wafer, and applying an oxide layer onto the surface thereof, thereby to stabilize the interior of the device against effects of the external atmosphere. With such a method, the surface condition of the base material underlying the applied oxide film determines the electrical characteristics of the completed semiconductor device.

It is well known in the art that when the surface of a silicon wafer is oxidized in a high temperature oxidizing atmosphere, there is a tendency to form donor type surface states on the interface between the wafer and the silicon oxide film and to cause the surface conductivity type to be of n-type. According to experiments made by the present inventor such a tendency was also found in the case when an oxide film was deposited by pyrolytic decomposition of an organo oxy-silane, but such a tendency was found to be smaller than when an oxide film was formed by the oxydation of the silicon wafer itself in the above mentioned high temperature oxidizing atmosphere. However, this tendency has substantial merit in the case when the surface of a $p^+nn^+$-type diode element is coated with a film of silicon dioxide produced by the pyrolytic decomposition of an organo-oxy-silane, especially when the resistivity of the n-type portion of the wafer is high. In a diode fabricated from an n-type wafer having a resistivity of about 100 Ω-cm., the lowering of the breakdown voltage after treatment relative to its value prior to treatment has been unavoidable, because the surface becomes more pronouncedly of the n-type.

It is therefore the principal object of this invention to eliminate the disadvantage mentioned above.

According to this invention, an extremely small quantity of an impurity which functions as an acceptor is added at the time when the pyrolytic decomposition of the organo-oxy-silane is carried out, whereby the above mentioned tendency of conversion of the wafer to the n-type is compensated, thus preventing the deterioration of the electrical characteristics of the semiconductor device.

While the specification concludes with claims particularly pointing out and distinctly claiming the subject matter of this invention, it is believed that the invention will be better understood from the following description taken in connection with the accompanying drawing in which a single figure illustrates one preferred embodiment of this invention.

Referring now to the accompanying drawing, a $p^+nn^+$-type silicon wafer was cut to have a dimension of about 1.5 x 1.5 $mm.^2$. After chemically lapping followed by cleaning of the surface, the silicon element 1 was placed on a quartz plate 2 and heated to a temperature of about 700° C. in a furnace 3 while nitrogen gas containing a vapor of tetra-ethoxy-silane was passed through the electric furnace from one end thereof, as indicated by an arrow 4. During this treatment, a trace of a powder 5 of $B_2O_3$ was placed on the quartz plate 2, and it was found that the breakdown voltage was increased to 375 v. from 305 v., the value prior to the heat treatment. When no $B_2O_5$ powder is used, the breakdown voltage does not increase after treatment, so that the above result of the experiment means that the tendency of converting to an n-type surface is compensated for by the introduction of said acceptor-type impurity.

While the invention has been described in terms of a preferred embodiment, it should be understood that this invention can be varied widely without departing from the spirit and scope of this invention.

For example, mixing of a very small quantity of the powdered $B_2O_3$ with the tetra-ethoxy-silane can be carried out, or a method adopted wherein the core tube of the furnace is divided into two regions of different temperatures, i.e., one region maintained at a temperature of about 700° C. to effect decomposition of the silane, and the other region containing the powdered $B_2O_3$, the temperature of said other region being adjusted to such a temperature as to cause the concentration of the acceptor on the surface to compensate for the tendency of the surface to become of the n-type due to the deposition of said oxide film.

Furthermore, in addition to the above described method of forming an oxide film by the pyrolytic decomposition of a silane, this invention can be equally applied to any usual method of forming a film of silicon oxide, for example, a method of forming a film of $SiO_2$ on the surface of a semiconductor device produced by evaporation or a method wherein a film of $SiO_2$ is formed on a silicon wafer in steam.

In the foregoing disclosure, we have explained the principle and operation of our invention and have the illustrated and described the best embodiment thereof. However, it should be understood that the invention is not limited thereto, but may be modified in various ways without departing from the true scope thereof as defined in the appended claim.

What is claimed is:

In the method of manufacturing a semiconductor device having a surface stabilized by depositing on the surface of said semiconductor device a film of silicon dioxide by the pyrolytic decomposition of an organo-oxy-silane, the steps of placing said semiconductor device in a first temperature region of a furnace having two temperature regions, the said first region having a temperature of substantially 700° C. to effect said pyrolytic decomposition of said organo-oxy-silane to form said film of silicon dioxide on the surface of said semiconductor device, placing a substance which serves as an acceptor for said semiconductor material in the second temperature region of the furnace, and heating said second region to a temperature to control the vapor pressure of said acceptor substance, thereby causing concentration of the acceptor on the surface and deposition of said film of silicon dioxide on the surface of said semiconductor surface by the pyrolytic decomposition of said organo-oxysilane while, at the same time, to introduce by diffusion of said acceptor substance into the surface of said semiconductor device, thereby compensating for the effect of the donor type surface states of the surface of said semiconductor material.

References Cited by the Examiner

UNITED STATES PATENTS

| | | | |
|---|---|---|---|
| 2,804,405 | 8/1957 | Derick et al. | 148—188 X |
| 2,873,222 | 2/1959 | Derick | 148—187 X |
| 3,055,776 | 12/1960 | Stevenson | 148—187 |
| 3,066,052 | 11/1962 | Howard | 148—188 X |
| 3,200,019 | 8/1965 | Scott et al. | 148—187 X |

HYLAND BIZOT, *Primary Examiner.*